United States Patent
Lee et al.

(10) Patent No.: US 7,471,084 B2
(45) Date of Patent: Dec. 30, 2008

(54) EXTREMELY LOW FREQUENCY (ELF) OR LOW FREQUENCY (LF) MAGNETIC FIELD DISTRIBUTION MEASURING SYSTEM

(75) Inventors: Dong-Il Lee, Daejeon Metropolitan (KR); Koo-Yong Shin, Daejeon Metropolitan (KR); Seong-Doo Lee, Daejeon Metropolitan (KR); Youn-Myoung Gimm, 22-505 Jangmi Apt., 11, Shincheon-dong, Songpa-gu, Seoul (KR) 138-240

(73) Assignees: Korea Electric Power Corporation (KR); Youn-Myoung Gimm (KR)

( * ) Notice: Subject to any disclaimer, the term of this patent is extended or adjusted under 35 U.S.C. 154(b) by 257 days.

(21) Appl. No.: 11/331,843

(22) Filed: Jan. 13, 2006

(65) Prior Publication Data
US 2006/0176053 A1  Aug. 10, 2006

(30) Foreign Application Priority Data
Jan. 17, 2005  (KR) .................. 10-2005-0004289

(51) Int. Cl.
G01R 33/02 (2006.01)
(52) U.S. Cl. ..................... 324/247; 324/260
(58) Field of Classification Search ......... 324/243–244, 324/247, 258, 260, 261; 600/407, 409
See application file for complete search history.

(56) References Cited

U.S. PATENT DOCUMENTS

| | | | | |
|---|---|---|---|---|
| 4,023,093 | A | * | 5/1977 | Aslan .................... 324/247 |
| 5,256,960 | A | * | 10/1993 | Novini .................... 324/72 |
| 5,789,929 | A | | 8/1998 | Hankui |
| 2007/0132464 | A1 | * | 6/2007 | Desplats et al. ............. 324/754 |

* cited by examiner

Primary Examiner—Jay M Patidar
(74) Attorney, Agent, or Firm—Daly, Crowley, Mofford & Durkee, LLP

(57) ABSTRACT

Disclosed herein is an ELF or LF magnetic field measuring system, which can easily measure each magnetic field component existing in a free space generated by electric appliances or in a human body phantom filled with a specific fluid. A 3-axes magnetic field probe for use in the magnetic field measuring system comprises resistive lines in a protective sleeve rod electrically connected to the transmission board, an isotropic sensing head having a cubic shape, one end of the protective sleeve rod being rigidly connected to a corner point of the cubic sensing head where three faces coincide, and three bobbins adhered to three adjacent faces which coincide at a corner point diagonally opposite to the first corner point. A coil is wound on the periphery of each of the bobbins.

The sensor is moved by an automatic mechanical machine to scan a pre-programmed surface where the magnetic field distribution is to the evaluated.

2 Claims, 9 Drawing Sheets

EXTREMELY LOW FREQUENCY (ELF) OR LOW FREQUENCY (LF) MAGNETIC FIELD DISTRIBUTION MEASURING SYSTEM

CROSS REFERENCE TO RELATED APPLICATION

The present application claims priority to Korean Patent Application No. 10-2005-0004289 filed on Jan. 17, 2005, which is incorporated herein by reference.

BACKGROUND OF THE INVENTION

1. Field of the Invention

The present invention relates to an extremely low or low frequency (ELF or LF) magnetic field distribution measuring system, which can achieve a good isotropy and a high spatial resolution by use of a small 3-axes magnetic field probe.

2. Description of the Related Art

As a well known fact, electricity has become an essential energy source for modern life. However, it became important to prepare appropriate measures to prevent electric and magnetic fields, if they are overwhelming, inevitably generated by the use of the electricity, from being inflicted possible harmful effects on the human body.

Generally, when being exposed to low frequency electric or magnetic fields, the human body experiences only a slight energy absorption and imperceptible body temperature increases. The major mechanism of the interaction by the outer field below 100 kHz is the induction of currents in the body. However, when being exposed to an electromagnetic field of approximately 100 kHz or more, the human body suffers body temperature increase by energy absorption. Generally, the human body experiences very inhomogeneous energy accumulation or field distribution if it is exposed to uniform electromagnetic fields. Thus, the energy accumulation or field distribution must be evaluated based on the measurement or calculation of the exposure.

Electromagnetic fields, generated from power transmission lines or household electrical appliances mainly have a frequency of 50 Hz or 60 Hz spectrum. Accordingly, there are many ongoing studies worldwide about the effect of ELF (extremely low frequency) frequencies of 50 Hz and 60 Hz, or LF (low frequency) magnetic fields on the human body.

Conventional probes for use in the measurement of ELF or LF magnetic fields, are designed to represent the sum of components for omnidirectional characteristic or designed for uniaxial measurement. In case of a single axis probe, it responds to only one field axis component. Thus, it is necessary to orient the probe orthogonally three times in order to obtain the correct magnitude of each vector. However, this sensing procedure is inconvenient to perform, time-consuming, and exhibits low measurement accuracy. If the magnitude of the field fluctuates as time, three orthogonal measurements can be almost meaningless.

However multiple axes sensors are used to sum up three components of a spatial field simultaneously. The multiple sensors are able to perform a measurement regardless of the polarization or direction of the existing field components. In this case, there is the need of a small isotropic probe having three axes arranged perpendicular to each other. The small isotropic probe ensures that root-sum-square (rss) values of the measured field are constant regardless of the direction of a magnetic field vector.

For the space resolution of the measurement, the probe is configured in IEC 62233 (2002) to have a cross sectional area of less than 0.01 m². However, with such a great cross sectional area of the conventional low frequency 3-axes probe, it is not possible when the probe should be located excessively close to a field source. As a result, using the conventional low frequency 3-axes probe it is difficult to measure a near field having a very steep rate of spatial change and it exhibits only a very low spatial resolution.

SUMMARY OF THE INVENTION

The object of the present invention is to provide a magnetic field measuring system, which can easily measure the existing field in a free space generated by electric appliances or in a human body phantom filled with a specific fluid where the space is not big enough compared with the conventional sensor size.

Another object of the present invention is to provide a magnetic field measuring system in which a probe having a more compact structure is used to measure a near field at a location adjacent to a field generation source, thereby achieving a high spatial resolution.

In accordance with the present invention, the above and other objects can be accomplished by the provision of a magnetic field measuring system comprising: a probe to sense magnetic field value; a transmission board to collect and transmit data measured by the magnetic field probe; and a computer having a microprocessor to record and process the data transmitted from the transmission board, and to control the automatic mechanical probe positioning system (robot) via a position controller for the surface scanning; a linear protective sleeve tube wherein electrical wires are connected from the sensor to the transmission board; an isotropic sensing head having a cube shape and having three bobbins arranged at three adjacent faces of the cube joined at a corner point of the cubic head which is diagonally opposite to the corner for connection with the sleeve tube rod, a coil being wound on the periphery of each of the bobbins.

Preferably, each of the bobbins may have a square or a circular plate shape to come into close contact with each face of the cubic head, and is formed, along the periphery thereof, with a groove for the winding of the coil.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Now, a preferred embodiment of the present invention will be explained with reference to the accompanying drawings.

Figure 1:
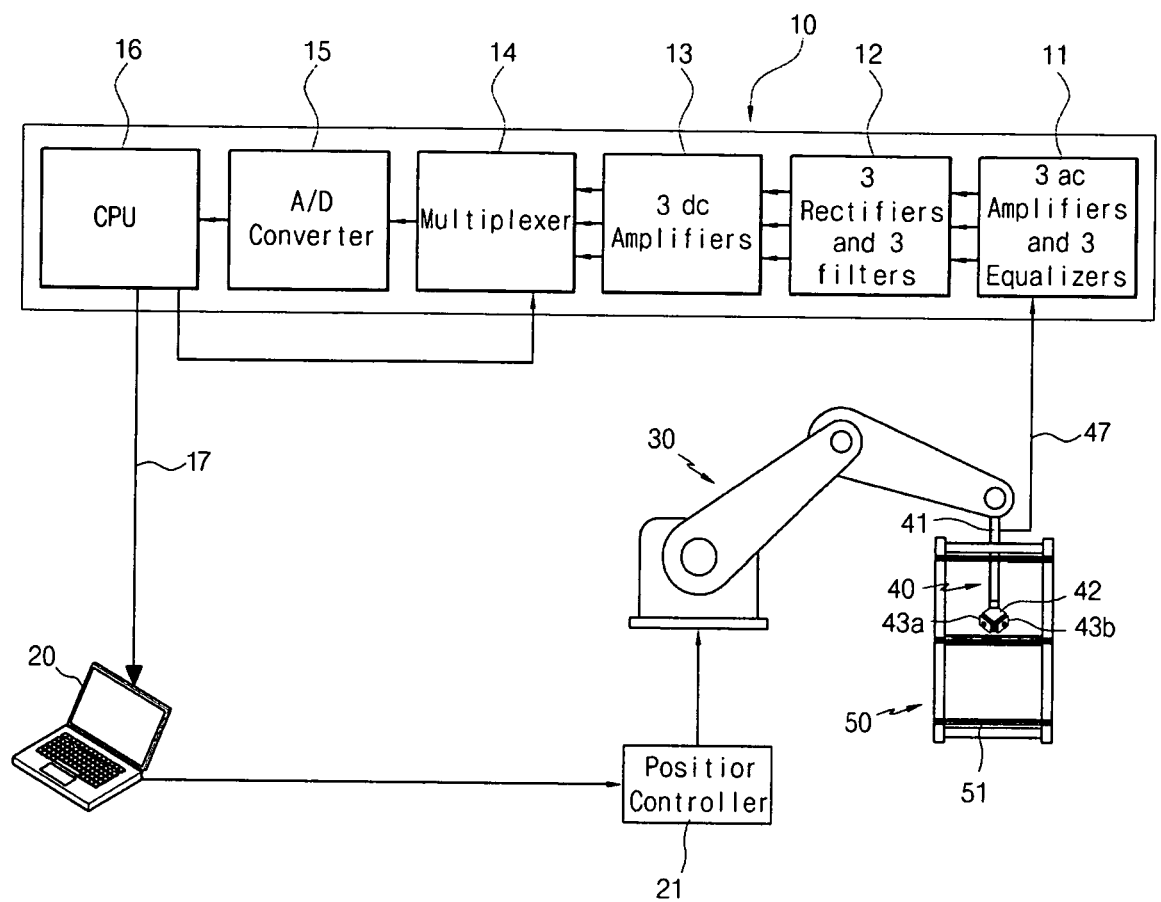
FIG. 1 is a schematic view illustrating a magnetic field measuring system in accordance with the present invention.

A magnetic field measuring probe according to the present invention is a small isotropic 3-axes probe, which can measure a near field regardless of direction or orientation of the probe axis and achieve a high spatial resolution. As shown in FIG. 1, the magnetic field measuring system according to the present invention includes: a 3-axes magnetic field probe 40 hanging down from a robot arm 30; a transmission board 10 to collect and transmit data measured by the probe 40; and a computer 20 to record and process the data transmitted from the transmission board 10.

If the computer 20 requires a specific signals detected by the probe 40, the CPU 16 selects and outputs the required specific channel signals by switching the multiplexer 14 to an appropriate position inside.

The output signals of the coil sensors are amplified by a predetermined gain by use of an amplification and equalizing circuit 11 for flat frequency characteristic in ELF and LF bands, rectified and filtered in 12 to produce dc signals, and dc signals are amplified by the dc amplifiers 13. They are switched in sequence one by one in the multiplexer 14 controlled by microprocessor 16, and subsequently, are input into an A/D converter 15 to be output as digital signals. Finally, the resulting digital signals are transmitted from data port of CPU 16 to the computer 20 through a communication channel 17. For this, the transmission board 10 includes: ac amplifiers and equalizers 11 compensating the frequency dependence of the sensor coils; 3 rectifying circuits and filters 12; 3 dc amplifiers 13, a multiplexer 14, A/D converter 15, and a CPU 16. With this configuration, the sensed signals, obtained from the 3-axes magnetic field probe 40, digital data of specific channels are transmitted via a channel 17 to computer 20 in accordance with the commands of the CPU 16.

The computer 20 serves to record and process the magnetic field values based on the data transmitted from the transmission board 10. The computer 20 includes a microcomputer (not shown) to calculate the root-sum-squared (rss) values measured by the 3-axes magnetic field probe 40.

Meanwhile, the 3-axes magnetic field probe 40 is attached to the robot arm 30, which is controlled by a position controller 21. The robot arm 30 moves the sensor 40 to constitute a scanning surface with the sensor head 42 to measure the field distribution.

Figure 2:
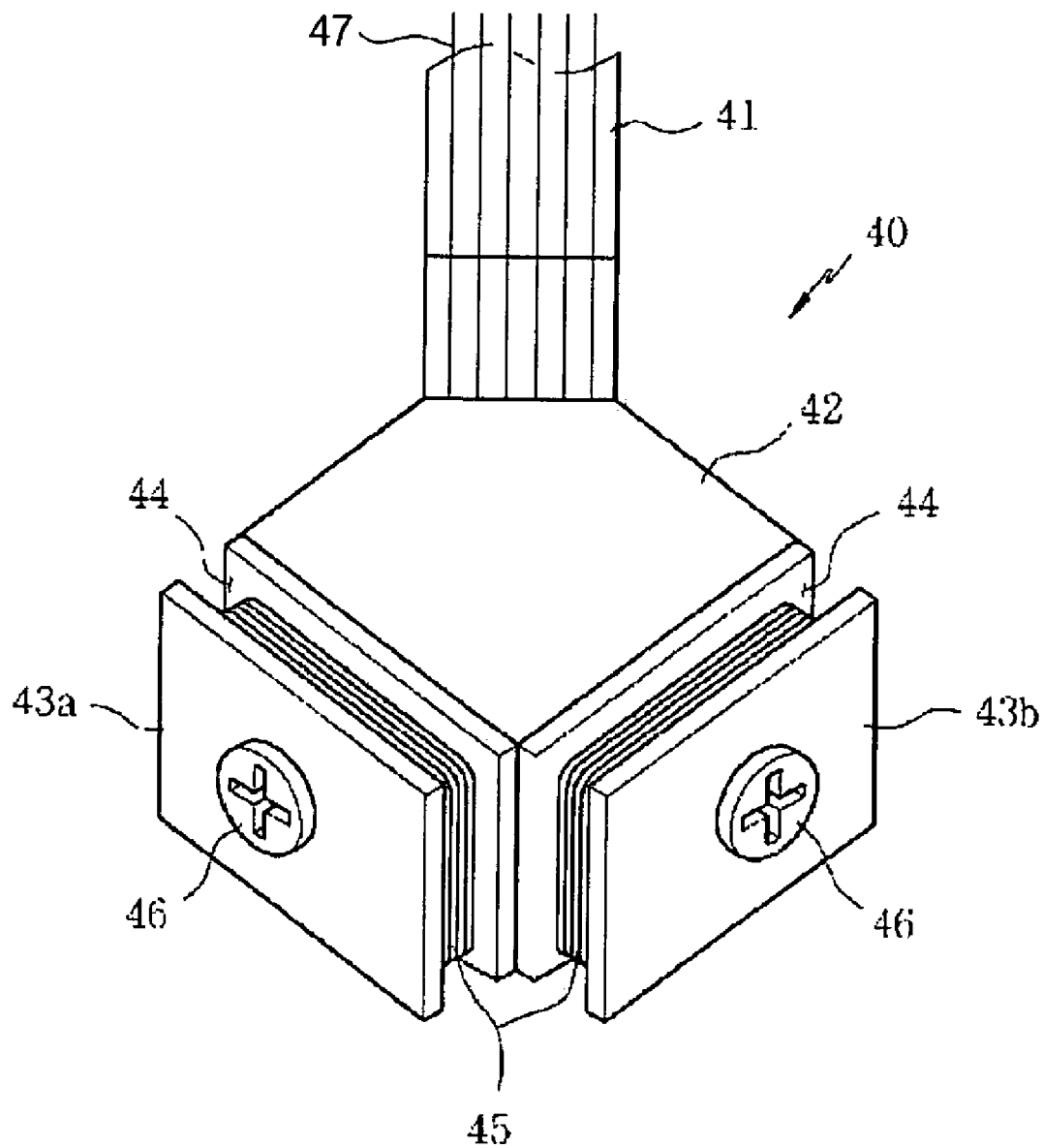
FIG. 2 is a top perspective view illustrating a 3-axes magnetic field probe included in the measuring system in accordance with the present invention.
Figure 3:
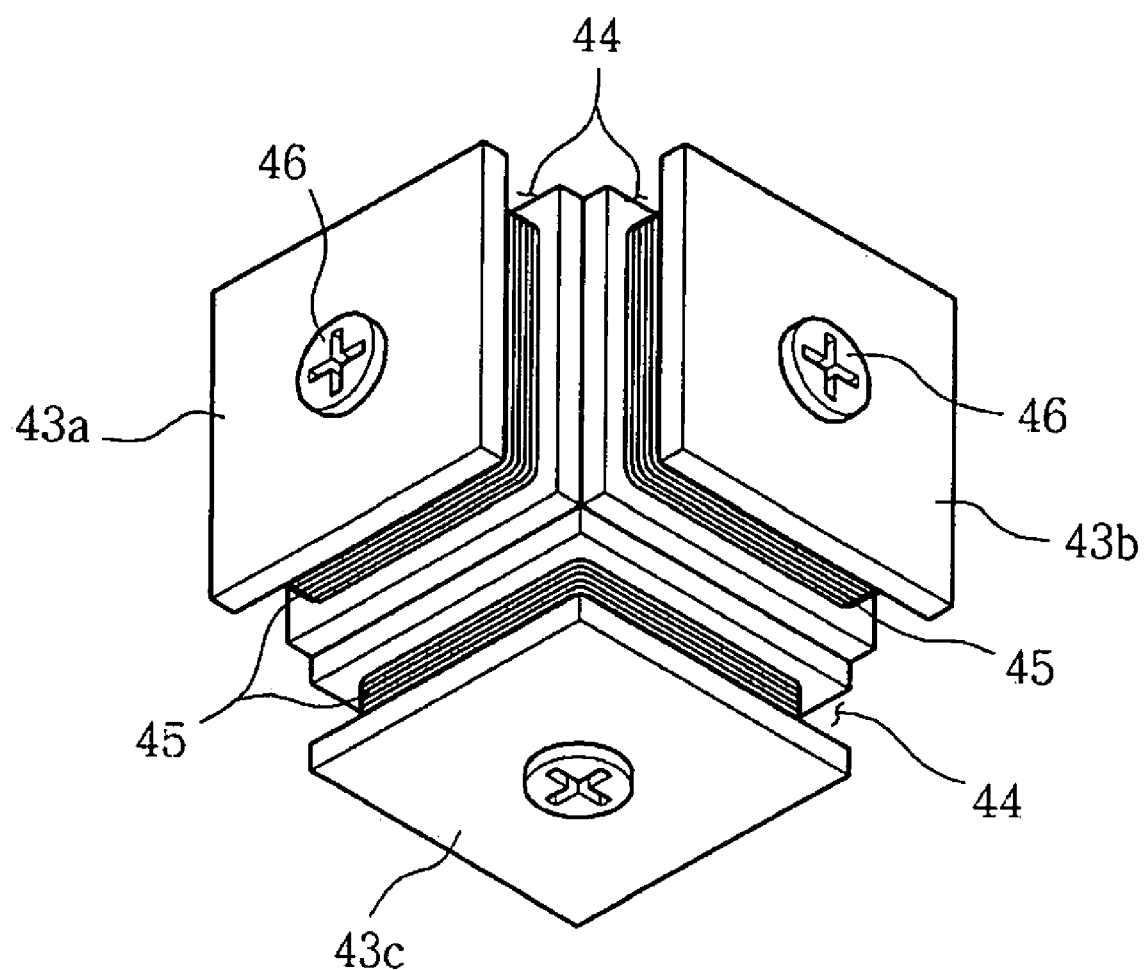
FIG. 3 is a bottom perspective view illustrating the 3-axes magnetic field probe as viewed from the direction of arrow III in FIG. 2.

As shown in FIGS. 2 and 3, the 3-axes magnetic field probe 40 includes: a protective sleeve tube 41 for electrical connection from the three coil sensors to the transmission board 10 via the six resistive wires 47; an isotropic sensing head 42 having a cubic shape, an end of the protective sleeve tube 41 being rigidly connected to a corner point of the head 42 where three faces coincide; and three bobbins 43a, 43b, and 43c arranged at three adjacent faces, which coincide together at the diagonally opposite corner to the former corner; a coil 45 being wound on the periphery of each of the bobbins 43a, 43b, and 43c.

The reason why the sensing head 42 is provided with a cubic structure is to ensure that the sum of the values detected from all the three axes is constant regardless of the probe orientation, thereby allowing the sensing head 42 to have the isotropic characteristic.

The connection tube 41 provides a route for the passage of detected ac signals. Preferably, the connective tubing rod 41 is made of a material having substantially no effect on an exterior magnetic field.

As stated above, the cube shaped isotropic sensing head 42 is securely connected by male-female threads, at the first corner point thereof, i.e. at the junction point of three faces, to the end of the protective connection tube 41. The basic material of the cube structure of isotropic sensing head 42 is Teflon with low dielectric constant, nonconductive and nonmagnetic characteristics. A thin covering material of head 42 can protect the head from the surrounding liquid when the head is immersed in the liquid in the phantom or in any other containers.

The three bobbins 43a, 43b, and 43c are fastened to the three adjacent faces of the isotropic sensing head 42 by the nonmagnetic insulating screws 46, respectively. The coils 45 are wound along the periphery of each of the bobbins 43a, 43b, and 43c with thousands of turns. The bobbins 43a, 43b, and 43c have a square or a circular plate shape suitable to come into close contact with the outer faces of the sensing head 42. Throughout the periphery of each of the bobbins 43a, 43b, and 43c, a winding groove 44 is formed for the winding of the coil 45. Similarly, the bobbins 43a, 43b, and 43c are made of Teflon.

To ensure the low frequency magnetic field probe 40 is very sensitive, it is desirable that an extremely thin wire be wound in order to increase the number of coil turns. In the embodiment of the present invention, the coil 45 is a copper wire having a diameter of 0.1 mm range, and is wound around each of the bobbins 43a, 43b, and 43c with approximately 2500 turns. Also, leading and tail ends of the coil 45 are electrically connected to the six resistive lines 47 along the protective sleeve tube 41. The reason of the resistive lines is to perturb the surrounding electromagnetic environment as small as possible. If the length of a side of the bobbin 43 has a relatively small value of 10 mm to 20 mm, the overall size of the magnetic field probe 40 is reduced, achieving a good spatial resolution.

In conclusion, the three bobbins 43a, 43b, and 43c, wound with the coil 45, are attached to the outer surface of the isotropic sensing head 42 in 3-axes directions, to provide the sensing head 42 with good isotropic characteristics.

Now, the operation and effects of the 3-axes magnetic field probe having the above-described configuration will be explained with reference to experimental results provided by the inventors of the present invention.

Figure 4:
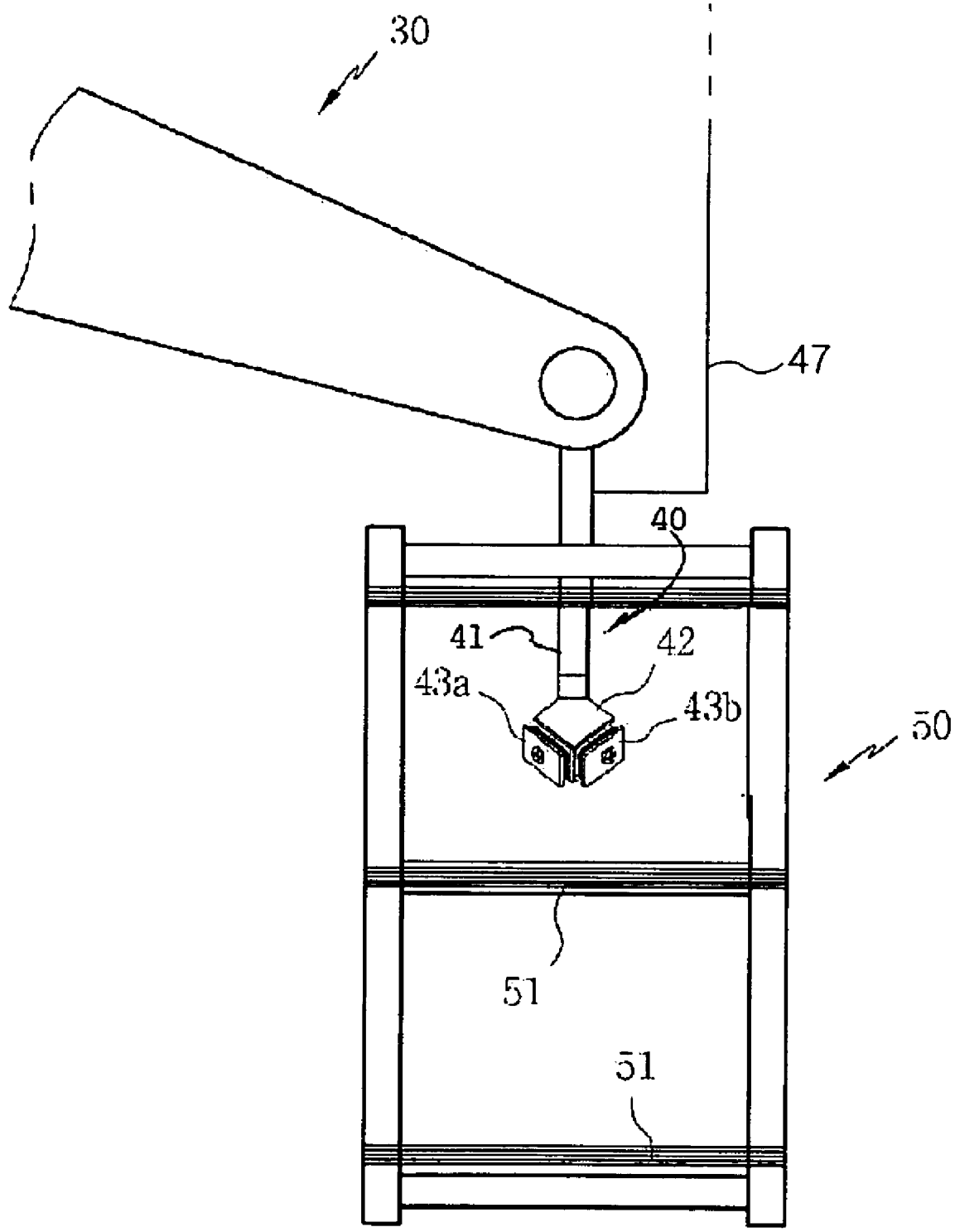
FIG. 4 is a view illustrating the 3-axes magnetic field probe located inside a magnetic field generator.

The embodiment of the present invention explains an example wherein the 3-axes magnetic field probe 40 is inserted in a uniaxial magnetic field generator 50 as shown in FIG. 4 to survey the magnetic field distribution.

The uniaxial magnetic field generator 50 is manufactured by connecting three coils 51 in series on hexahedral shaped wooden frame of 19 cm (width)×28 cm (depth)×44 cm (height) dimension.

Specifically, in the present embodiment, the two coils 51 are wound 20 turns each on upper and lower ends of the wooden frame body, and the middle coil of 51 is wound 17 turns, to generate the most uniform magnetic field inside of the wood frame 50.

First, in a state wherein a predetermined voltage is applied to the magnetic field generator 50 in FIG. 4, the 3-axes magnetic field probe 40 is located in the central region between the upper and middle coils 51 of the magnetic field generator 50, to check the magnetic field distribution on the horizontal plane inside the frame 50.

Figure 5:
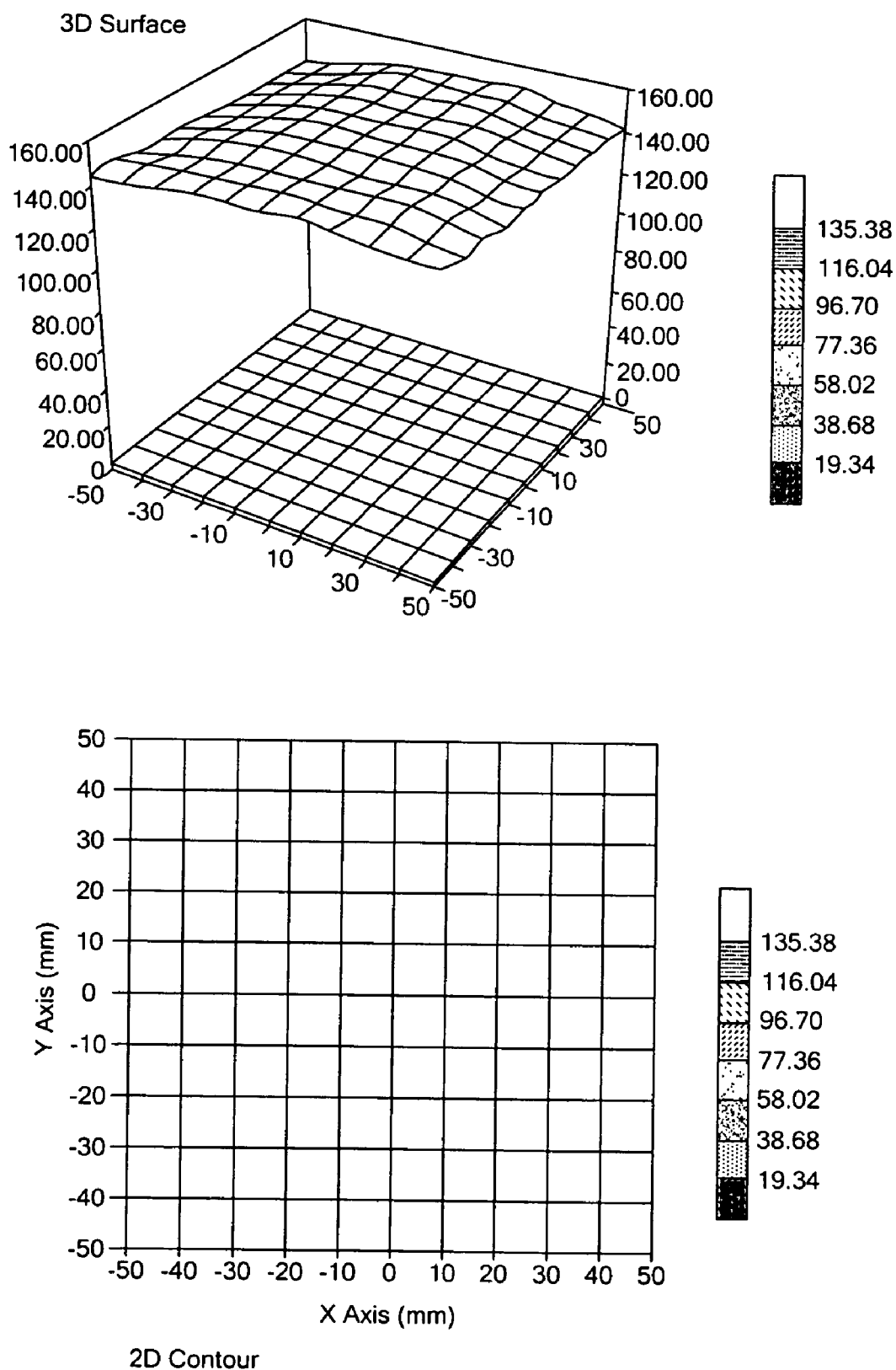
FIG. 5 is a view illustrating field intensity distribution on the scanned interior horizontal plane of the magnetic field generator in FIG. 4.

Specifically, the 3-axes magnetic field probe 40 is connected to the robot arm 30 installed with transmission board 10, to scan the inside square of 10 cm width 10 cm depth. In this case, the input voltage to the three serial coils 51 is 0.3V/60 Hz. As a result of scanning the interior space of the magnetic field generator 50, it can be found from FIG. 5 that the magnetic field exhibits a considerably uniform distribution. The height in the left FIG. 5 is so much the same that the contour line is not seen in the sight FIG. 5.

Figure 6:
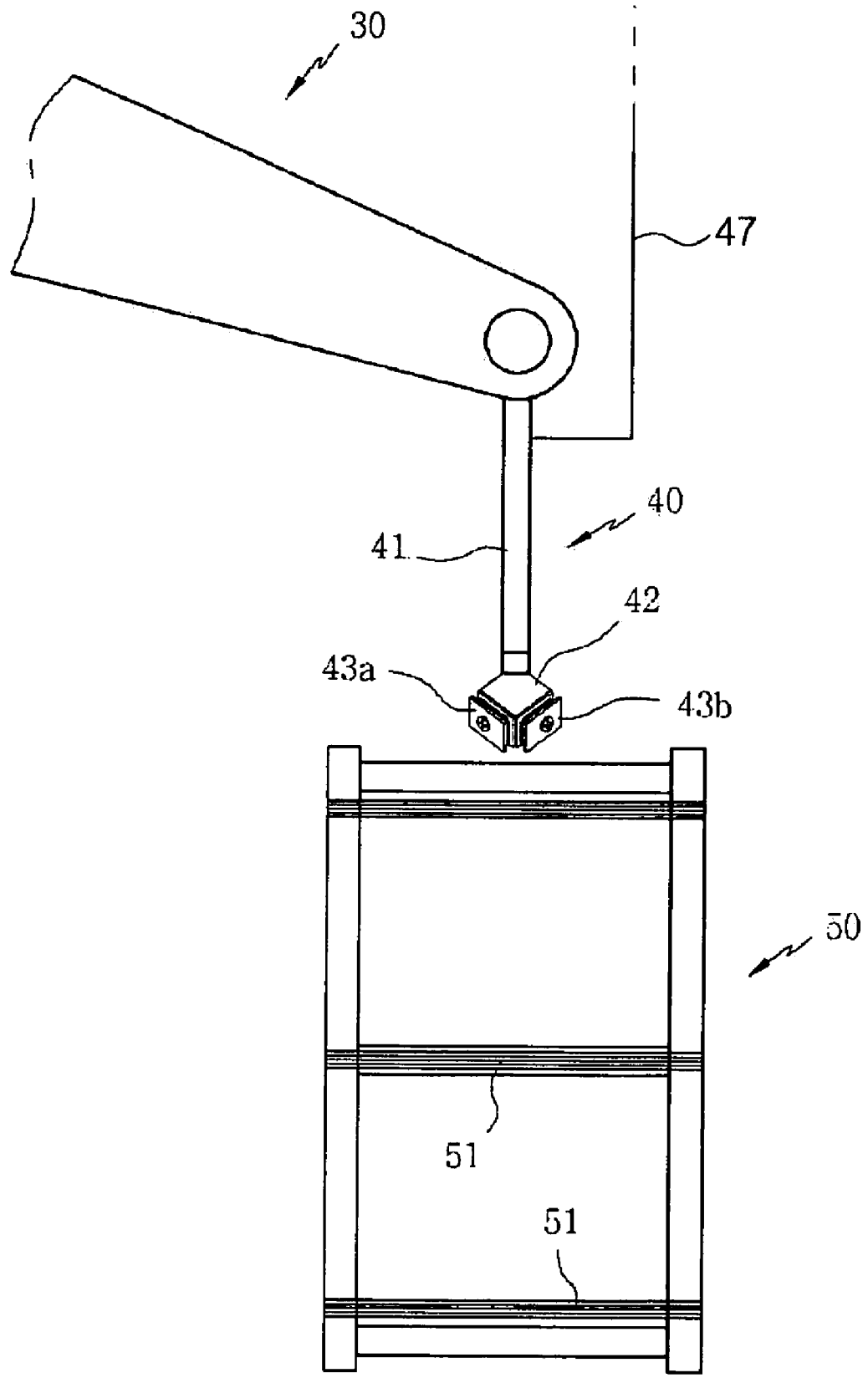
FIG. 6 is a view illustrating the 3-axes magnetic field probe located right above the top plane of the magnetic field generator.
Figure 7:
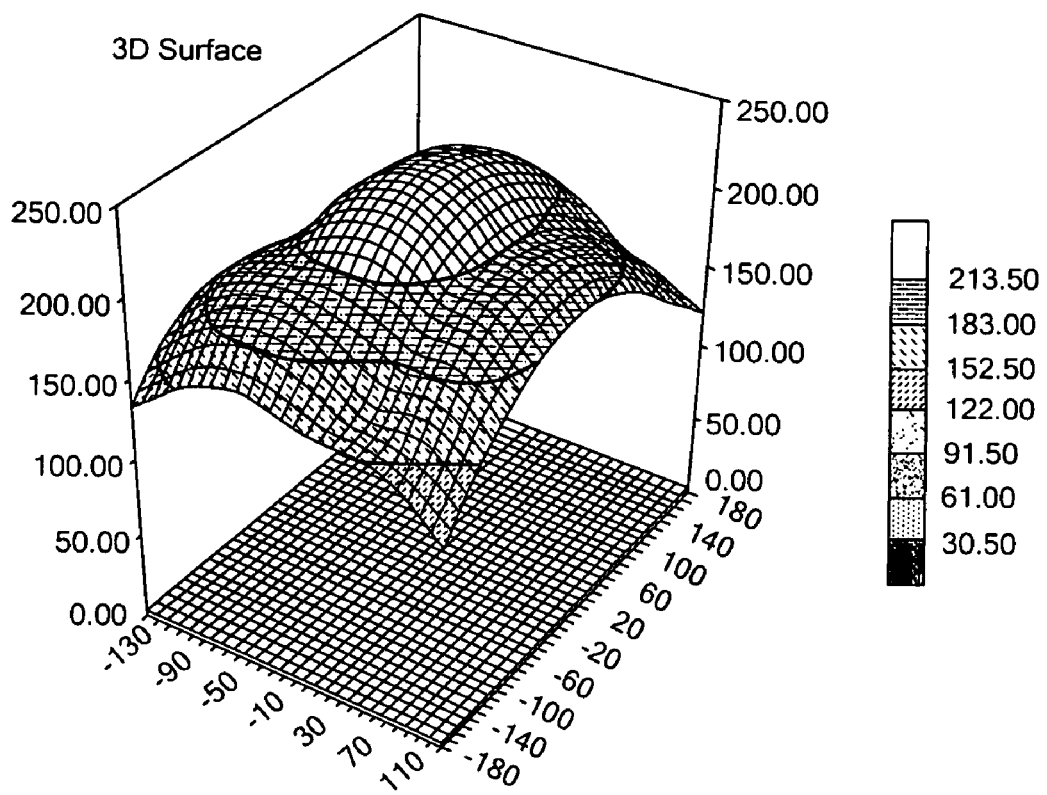
FIG. 7 is a view illustrating the field intensity distribution in the scanned surface of FIG. 6.
Figure 7:
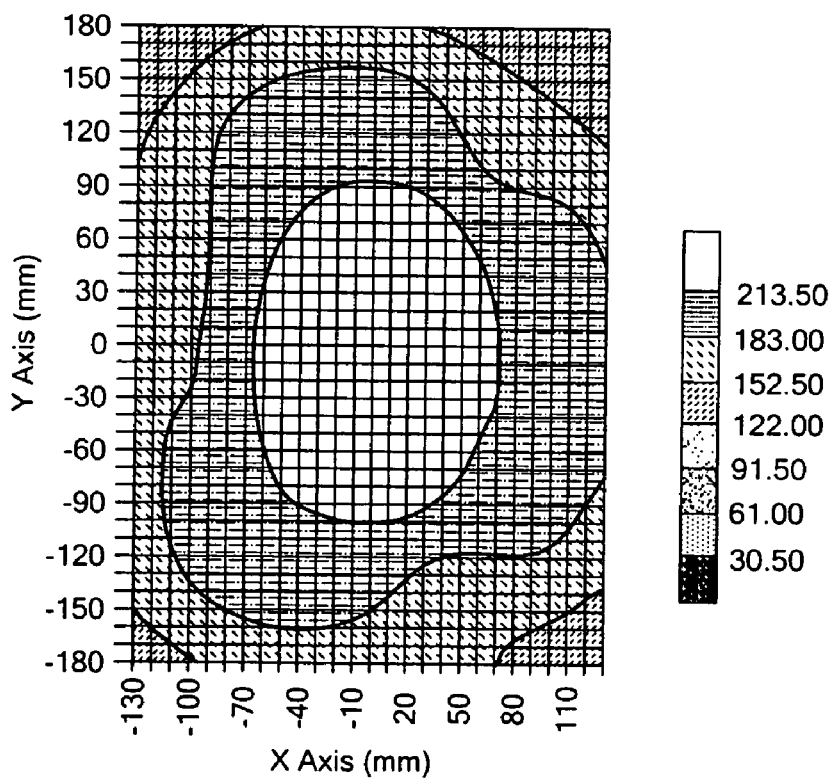

Next, referring to FIG. 6, in the upstanding state of the magnetic field generator 50, the 3-axes magnetic field sensor 42 is located above the upper coil 51 to scan a horizontal plane right above the top rectangle of the magnetic field generator 50, to evaluate the field distribution. Specifically, the 3-axes magnetic field probe 40 is connected to the robot arm 30 to scan an exterior space, having an area of 26 cm long and 36 cm wide to include enough the rectangular coil aperture of the magnetic field generator 50. In this case, the input voltage of the coil is 0.6V/60 Hz. As a result of scanning the 26 cm long and 36 cm wide rectangular region right above the top plane of the magnetic field generator 50, it can be found from FIG. 7 that the magnetic field exhibits a relatively less uniform field strength distribution than in FIG. 5, and the strength of the magnetic field is rapidly reduced at the outer skirt of the scanned region.

Figure 8:
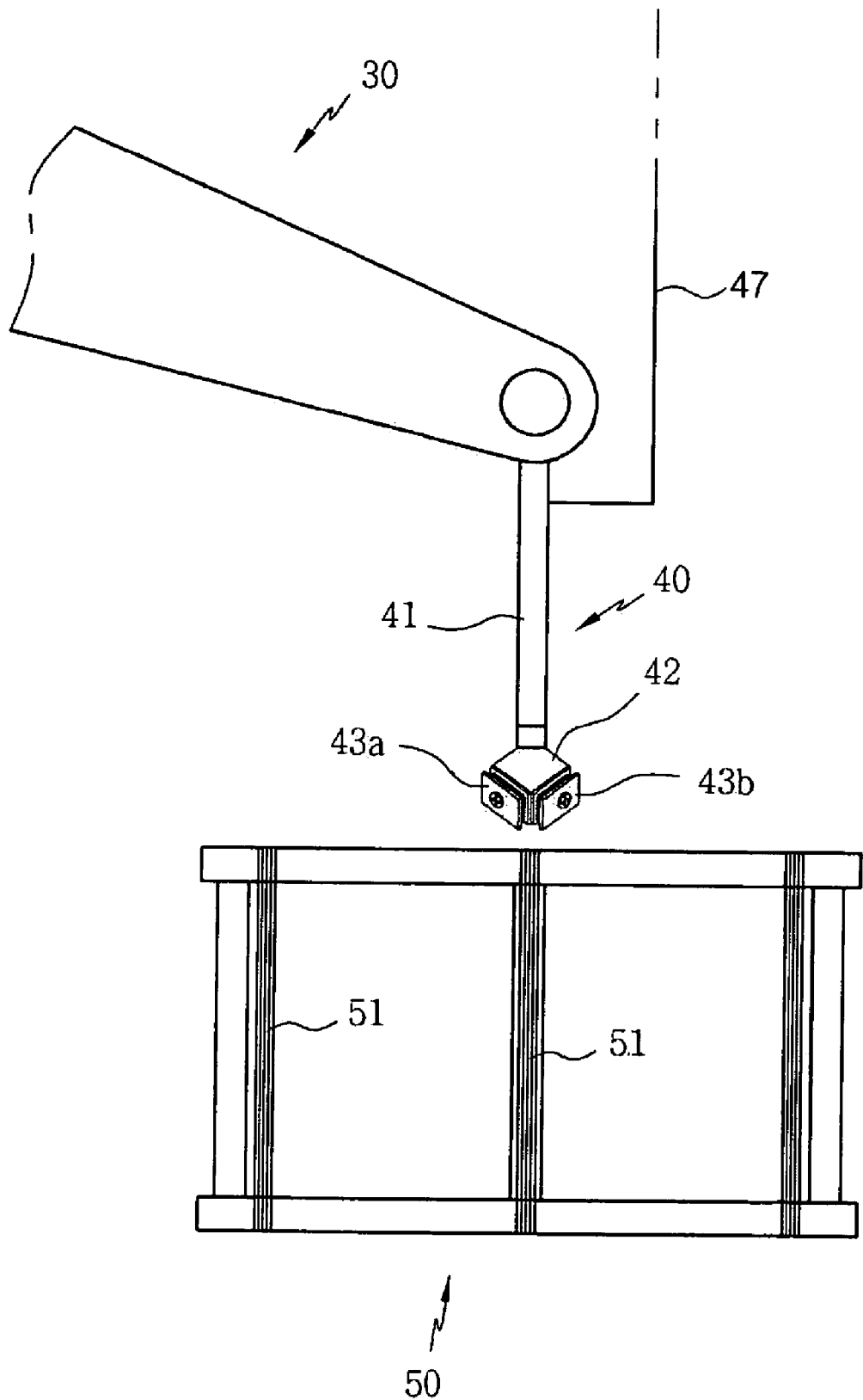
FIG. 8 is a view illustrating the 3-axes magnetic field probe located close to a lateral surface of the magnetic field generator.

Finally, referring to FIG. 8, in a state wherein the magnetic field generator 50 is laid down on the nonmagnetic, nonconductive floor, the magnetic field probe 40 scans a horizontal plane right above the down-lying magnetic field generator 50, to evaluate the outside magnetic field distribution. Specifically, the 3-axes magnetic field probe 40 is positioned in the plane as close to the top surface of the laid magnetic field generator 50, to scan an exterior surface having an area of 24 cm long and 46 cm wide for the entire coverage of the coil frame 50. In this case, the input voltage of the coil is 0.6V/60 Hz.

Figure 9:
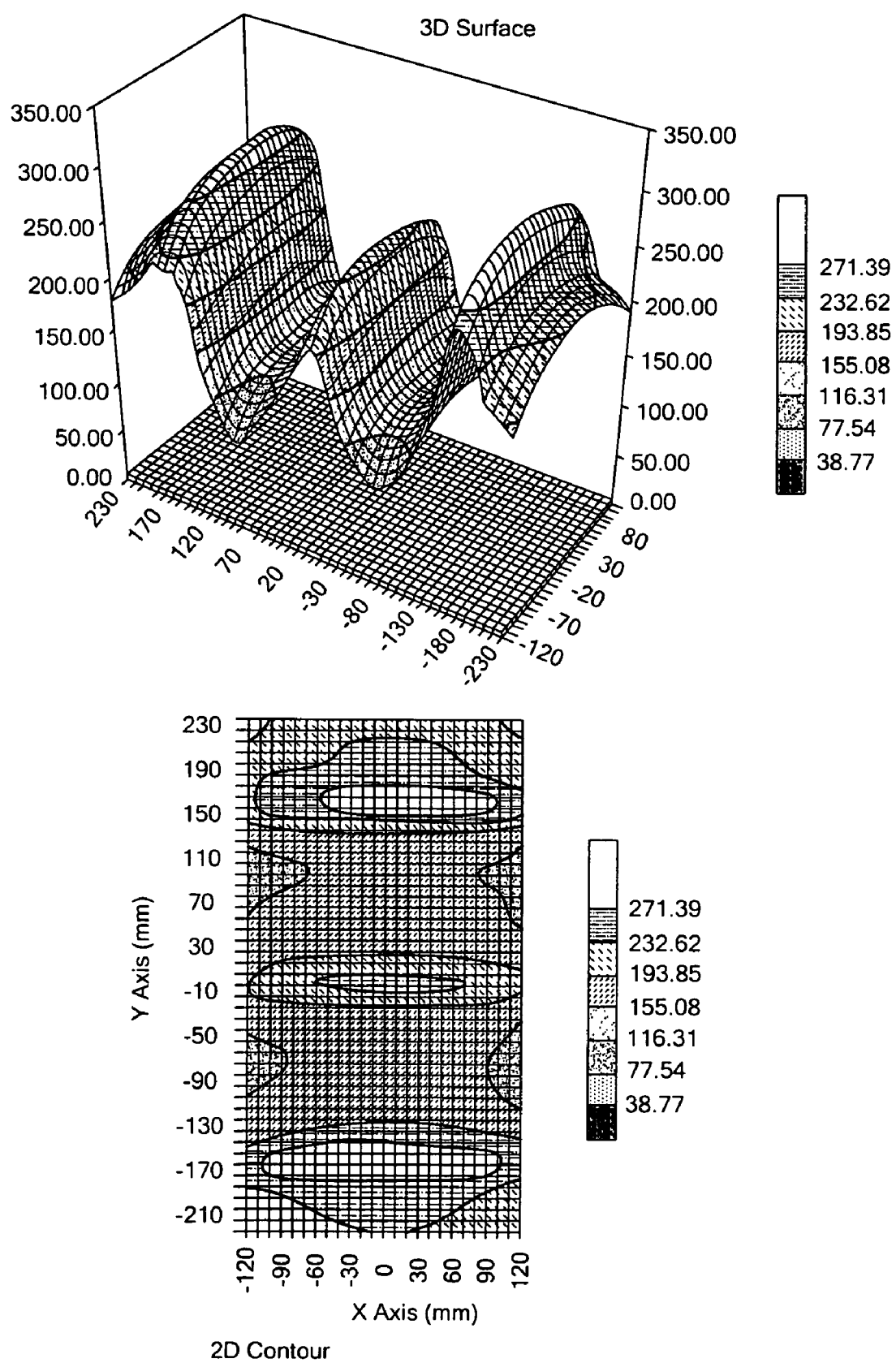
FIG. 9 is a view illustrating the field intensity distribution by scanning an exterior horizontal plane close to the lateral surface of the magnetic field generator in FIG. 8.

As a result of scanning the exterior plane of the laid magnetic field generator 50 by use of the 3-axes magnetic field probe 40, it can be found from FIG. 9 that the strength of a magnetic field becomes the highest in vicinity of the coils 51.

As stated above, the magnetic field probe 40 having three coil sensors can achieve an isotropic characteristic regardless of its orientation, achieving a high spatial resolution. Also, the 3-axes magnetic field sensor head 42 can be manufactured to have a cross sectional area of less than 4 cm$^2$. In this case, the probe 40 can measure a near field with a more improved spatial resolution.

Meanwhile, preferably, the probe 40 according to the present invention is waterproofed. In this case, the 3-axes magnetic field probe 40 can perform a measurement even when it is immersed in a human body phantom filled with a specific fluid simulating human tissue. To achieve a complete waterproof, the 3-axes magnetic field probe 40 may be dried up after filling the nonmagnetic, nonconducting impregnation solution in vacuum environment.

As is apparent from the above description, the present invention provides a magnetic field measuring system having an improved space resolution and directional isotropy. The probe includes: resistive lines 47 in a protective sleeve tube 41 electrically connected to a transmission board 10; an isotropic sensing head having a cubic shape 42, an end of the sleeve tube being rigidly connected to a corner point of the isotropic sensing head where three faces coincide; and three bobbins at three adjacent sensor faces which coincide at a corner point diagonally opposite to the former corner point, a coil being wound on the periphery of each of the bobbins.

With the configuration described above, it is possible to more easily measure the magnetic field existing in a free space generated by electric appliances or in the phantom of human body filled with human simulant liquid, without rotating the magnetic field probe for the composition of three field components. Further, since the size of the magnetic field probe can be reduced, the measurement of an even nearer field is possible, and a better spatial resolution can be achieved.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A magnetic field measuring system comprising: a magnetic field probe to sense ELF or LF magnetic field components; a transmission board to collect and transmit data measured by the magnetic field probe; and a computer to record and process the data transmitted from the transmission board, wherein the magnetic field probe comprises;

resistive lines in a protective linear connective sleeve tube electrically connected to the transmission board;

an isotropic sensing head having a cubic shape, an end of the protective sleeve tube being rigidly attached to a corner point of the isotropic sensing cube head where three faces coincide; and three bobbins attached to three adjacent faces of the sensing cube which coincide at the diagonally opposite corner to the former corner point, a coil being wound on the periphery of each of the bobbins.

2. The system as set forth in claim 1, wherein each of the bobbins has a square planar shape to come into close contact with the outer face of the sensing head, and is formed, along the periphery thereof, with a groove for the winding of the coil.

\* \* \* \* \*